United States Patent
Perisetty

(10) Patent No.: US 7,592,832 B2
(45) Date of Patent: *Sep. 22, 2009

(54) ADJUSTABLE TRANSISTOR BODY BIAS CIRCUITRY

(75) Inventor: Srinivas Perisetty, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/163,695

(22) Filed: Jun. 27, 2008

(65) Prior Publication Data

US 2008/0258802 A1    Oct. 23, 2008

Related U.S. Application Data

(63) Continuation of application No. 11/369,664, filed on Mar. 6, 2006, now Pat. No. 7,495,471.

(51) Int. Cl.
*H03K 19/173* (2006.01)

(52) U.S. Cl. .............................. 326/37; 326/38; 326/47

(58) Field of Classification Search .................. 326/37, 326/38, 41, 47; 327/534–537, 540, 541, 327/539

See application file for complete search history.

(56) References Cited

U.S. PATENT DOCUMENTS

| 5,341,034 A | 8/1994 | Matthews |
|---|---|---|
| 5,422,591 A | 6/1995 | Rastegar et al. |
| 5,600,264 A | 2/1997 | Duong et al. |
| 5,610,533 A | 3/1997 | Arimoto et al. |
| 5,689,144 A | 11/1997 | Williams |
| 5,703,522 A | 12/1997 | Arimoto et al. |
| 5,744,996 A | 4/1998 | Kotzle et al. |
| 5,781,062 A | 7/1998 | Mashiko et al. |
| 5,841,694 A | 11/1998 | Wong |
| 5,852,552 A | 12/1998 | Kwon |
| 5,854,561 A | 12/1998 | Arimoto et al. |
| 5,905,402 A | 5/1999 | Kim et al. |

(Continued)

FOREIGN PATENT DOCUMENTS

EP    0 732 796 A2    9/1996

OTHER PUBLICATIONS

U.S. Appl. No. 11/369,664, filed Mar. 6, 2006, Perisetty.

(Continued)

*Primary Examiner*—Daniel D Chang
(74) *Attorney, Agent, or Firm*—Treyz Law Group; G. Victor Treyz; Nancy Y. Ru

(57) ABSTRACT

An integrated circuit is provided that contain n-channel and p-channel metal-oxide-semiconductor transistors having body terminals. Adjustable transistor body bias circuitry is provided on the integrated circuit that provides body bias voltages to the body terminals to minimize power consumption. The adjustable body bias circuitry can be controlled using programmable elements on the integrated circuit that are loaded with configuration data. The integrated circuit may be a programmable logic device integrated circuit containing programmable logic. The adjustable body bias circuitry can produce an adjustable negative body bias voltage for biasing n-channel metal-oxide-semiconductor transistors. The adjustable body bias circuitry contains a bandgap reference circuit, a charge pump circuit, and an adjustable voltage regulator.

21 Claims, 11 Drawing Sheets

U.S. PATENT DOCUMENTS

| | | | |
|---|---|---|---|
| 5,942,784 A | 8/1999 | Harima et al. | |
| 6,157,691 A | 12/2000 | Wei | |
| 6,232,793 B1 | 5/2001 | Arimoto et al. | |
| 6,271,713 B1 | 8/2001 | Krishnamurthy | |
| 6,292,639 B1 | 9/2001 | Inoue et al. | |
| 6,343,044 B1 | 1/2002 | Hsu et al. | |
| 6,351,176 B1 | 2/2002 | Houston | |
| 6,366,482 B1 | 4/2002 | Jeong | |
| 6,373,281 B1 | 4/2002 | Chuang et al. | |
| 6,429,726 B1 | 8/2002 | Bruneau et al. | |
| 6,476,372 B2 | 11/2002 | Merrill et al. | |
| 6,484,265 B2 | 11/2002 | Borkar et al. | |
| 6,518,825 B2 * | 2/2003 | Miyazaki et al. | 327/534 |
| 6,525,559 B1 | 2/2003 | Wu et al. | |
| 6,535,034 B1 | 3/2003 | Wong | |
| 6,549,032 B1 | 4/2003 | Shumarayev et al. | |
| 6,559,708 B2 | 5/2003 | Notani | |
| 6,590,440 B1 | 7/2003 | Williams et al. | |
| 6,597,203 B2 | 7/2003 | Forbes | |
| 6,605,981 B2 | 8/2003 | Bryant et al. | |
| 6,614,688 B2 | 9/2003 | Jeong et al. | |
| 6,650,141 B2 | 11/2003 | Agrawal et al. | |
| 6,670,655 B2 | 12/2003 | Lukes et al. | |
| 6,731,158 B1 | 5/2004 | Hass | |
| 6,744,301 B1 | 6/2004 | Tschanz et al. | |
| 6,777,978 B2 | 8/2004 | Hart et al. | |
| 6,809,968 B2 * | 10/2004 | Marr et al. | 365/185.24 |
| 6,972,593 B1 | 12/2005 | Wang et al. | |
| 6,972,599 B2 | 12/2005 | Forbes | |
| 6,980,033 B2 | 12/2005 | Forbes | |
| 7,098,689 B1 | 8/2006 | Tuan et al. | |
| 7,112,997 B1 | 9/2006 | Liang et al. | |
| 7,330,049 B2 | 2/2008 | Perisetty | |
| 2001/0012673 A1 | 8/2001 | Gyu-chul | |
| 2002/0005750 A1 | 1/2002 | Kao et al. | |
| 2002/0024378 A1 | 2/2002 | Forbes et al. | |
| 2002/0029352 A1 | 3/2002 | Borkar et al. | |
| 2002/0030533 A1 | 3/2002 | De et al. | |
| 2002/0031028 A1 | 3/2002 | Forbes et al. | |
| 2002/0033730 A1 | 3/2002 | Yao et al. | |
| 2002/0044076 A1 | 4/2002 | Yao et al. | |
| 2002/0075064 A1 * | 6/2002 | Fujii et al. | 327/536 |
| 2002/0079951 A1 | 6/2002 | Borkar et al. | |
| 2002/0118569 A1 | 8/2002 | Jeong et al. | |
| 2002/0140496 A1 | 10/2002 | Keshavarzi et al. | |
| 2002/0155671 A1 | 10/2002 | Lukes et al. | |
| 2002/0163377 A1 | 11/2002 | Bruneau et al. | |
| 2002/0171461 A1 | 11/2002 | Yamazaki et al. | |
| 2002/0171468 A1 | 11/2002 | Bryant et al. | |
| 2002/0179876 A1 | 12/2002 | Pang et al. | |
| 2003/0001633 A1 | 1/2003 | Gresham | |
| 2003/0001663 A1 | 1/2003 | Zhang | |
| 2003/0005378 A1 | 1/2003 | Tschanz et al. | |
| 2003/0016078 A1 | 1/2003 | Hinterscher | |
| 2003/0038668 A1 | 2/2003 | Zhang et al. | |
| 2003/0053335 A1 | 3/2003 | Hart et al. | |
| 2003/0067042 A1 | 4/2003 | Kaatz | |
| 2003/0080802 A1 | 5/2003 | Ono et al. | |
| 2003/0141929 A1 | 7/2003 | Casper et al. | |
| 2003/0151428 A1 | 8/2003 | OuYang | |
| 2003/0208611 A1 | 11/2003 | Weber et al. | |
| 2003/0209752 A1 | 11/2003 | Cai et al. | |
| 2003/0218478 A1 | 11/2003 | Sani et al. | |
| 2004/0016977 A1 | 1/2004 | Miyazaki et al. | |
| 2004/0123170 A1 | 6/2004 | Tschanz et al. | |
| 2005/0036346 A1 | 2/2005 | Kim et al. | |
| 2005/0231274 A1 | 10/2005 | Wu | |
| 2005/0258862 A1 | 11/2005 | Rahim et al. | |
| 2005/0280437 A1 | 12/2005 | Lewis et al. | |
| 2005/0280463 A1 * | 12/2005 | Chih | 327/538 |
| 2006/0038605 A1 | 2/2006 | Pineda De Gyvez et al. | |
| 2006/0119382 A1 | 6/2006 | Shumarayev et al. | |

OTHER PUBLICATIONS

U.S. Appl. No. 11/369,654, filed Mar. 6, 2006, Perisetty.
U.S. Appl. No. 12/044,864, filed Mar. 7, 2008, Perisetty.
U.S. Appl. No. 11/369,548, filed Mar. 6, 2006, Perisetty.
U.S. Appl. No. 11/959,949, filed Dec. 19, 2007, Perisetty.
U.S. Appl. No. 11/420,736, filed May 27, 2006.
U.S. Appl. No. 11/420,737, filed May 27, 2006.
"Challenges For Low-Power And High-Performance Chips", IEEE Design & Test Of Computers, Jul.-Sep. 1998, pp. 119-124.
Kawaguchi et al., "Dynamic Leakage Cut-Off Scheme For Low-Voltage SRAM's", IEEE, Symposium On VLSI Circuits Digest Of Technical Papers, 1998, pp. 140-141.
Nose et al., "Voltage Dependent Gate Capacitance And Its Impact In Estimating Power And Delay Of CMOS Digital Circuits With Low Supply Voltage", ISLPED, 2000, pp. 228-230.
Zyuban et al., "Low Power Integrated Scan-Retention Mechanism", ISLPED, Aug. 12-14, 2002, pp. 98-102.
Das et al., "Ultra Low-Leakage Power Strategies For Sub-1 V VLSI:Novel Circuit Styles And Design Methodologies For Partially Depleted Silicon-On-Insulator (PD-SOI) CMOS Technology", $16^{th}$ Internatinoal Conference on VLSI Design, 2003, 6 pgs.
Yeap, "Leakage Current In Low Standby Power And High Performance Devices: Trends And Challenges", ISPD, Apr. 7-10, 2002, pp. 22-27.
Huang et al., "Scalability And Biasing Strategy For CMOS With Active Well Bias", Abstract Only, *Symposium on VLSI Technology*, 2001, 1 pg.
Kawaguchi et al., "FP 12.4: A CMOS Scheme For 0.5V Supply Voltage With Pico-Ampere Standby Current", IEEE, 1998, pp. 12.4-1 to 12.4-10.
Heo et al., "Dynamic Fine-Grain Leakage Reduction Using Leakage-Biased Bitlines", $29^{th}$ Annual International Symposium For Computer Architecture (ISCA-29), May 2002, 11 pgs.
Kosonocky et al., "Enhanced Multi-Threshold (MTCMOS) Circuits Using Variable Well Bias", ISLPED, Aug. 6-7, 2001, pp. 165-169.
Kim et al., "Dynamic VTH Scaling Scheme For Active Leakage Power Reduction", Design, Automation And Test In Europe Conference And Exhibition, Mar. 2002, 5 pgs.
Gayasen et al., "Reducing Leakage Energy In FPGAs Using Region-Constrained Placement", FPGA, Feb. 22-24, 2004, 8 pgs.
Chen et al., "Low-Power Technology Mapping For FPGA Architectures With Dual Supply Voltage", FPGA, Feb. 22-24, 2004, 9 pgs.
Li et al., "Low-Power FPGA Using Pre-defined Dual-Vdd/Dual-Vt Fabrics", FPGA, Feb. 22-24, 2004, 9 pgs.
Anderson et al., "Active Leakage Power Optimization For FPGAs", FPGA, Feb. 22-24, 2004, pp. 33-41.
Kosonocky et al., "Low-Power Circuits And Technology For Wireless Digital Systems", IBM J. Res. & Dev., vol. 47, No. 2/3, Mar./May 2003, pp. 283-298.
Sakurai, "Low Power Design Of Digital Circuits", pp. 1-5.
Sakurai, "Recent Topics For Realizing Low-Power, High-Speed VLSIs", 6 pgs.
Sakurai, "Recent Topics For Realizing Low-Power, High-Speed VLSIs", Workshop on Advanced CMOS, Oct. 31, 2001, 24 pgs.
Heo et al., "Leakage-Biased Domino Circuits For Dynamic Fine-Grain Leakage Reduction", Symposium On VLSI Circuits, Jun. 2002, 4 pgs.
Tschanz et al., "Dynamic Sleep Transistor And Body Bias For Active Leakage Power Control Of Microprocessors", IEEE Journal Of Solid-State Circuits, vol. 38, No. 11, Nov. 2003, pp. 1838-1845.
Miyazaki et al., "A 1.2-GIPS/W Microprocessor Using Speed-Adaptive Threshold-Voltage CMOS With Forward Bias", IEEE Journal Of Solid-State Circuits, vol. 37, No. 2, Feb. 2002, pp. 210-217.
Tschanz et al., "Adaptive Body Bias For Reducing Impacts Of Die-To-Die And Within-Die Parameter Variations On Microprocessor Frequency And Leakage", IEEE Journal Of Solid-State Circuits, vol. 37, No. 11, Nov. 2002, pp. 1396-1402.
Kuroda et al., "Variable Supply-Voltage Scheme For Low-Power High-Speed CMOS Digital Design", IEEE Journal Of Solid-State Circuits, vol. 33, No. 3, Mar. 1998, pp. 454-462.

Inukai et al., "Variable Threshold Voltage CMOS (VTCMOS) In Series Connected Circuits", ISPLED, Aug. 6-7, 2001, 7 pgs.
Sakurai et al., "Low-Power CMOS Design Through $V_{TH}$ Control And Low-Swing Circuits", 1997, pp. 1-6.
Kawaguchi et al., "A Reduced Clock-Swing Flip-Flop (RCSFF) For 63% Clock Power Reduction", Symposium on VLSI Circuits Digest Of Technical Papers, 1997, pp. 97-98.
Kuroda et al., "A 0.9-V, 150-MHz, 10-mW, 4mm$^2$, 2-D Discrete Cosine Transform Core Processor With Variable Threshold-Voltage (VT) Scheme", IEEE Journal Of Solid-State Circuits, vol. 31, No. 11, Nov. 1996, pp. 1770-1779.
Nose et al., "Optimization of $V_{DD}$ and $V_{Th}$ For Low-Power And High-Speed Applications", Proceedings ASP-DAC, 2000, 6 pgs.
Kawaguchi et al., "A Super Cut-Off CMOS (SCCMOS) Scheme For 0.5-V Supply Voltage With Picoampere Stand-By Current", IEEE Journal Of Solid-State Circuits, vol. 35, No. 10, Oct. 2000, pp. 1498-1501.
Nose et al., "$V_{TH}$-Hopping Scheme To Reduce Subthreshold Leakage For Low-Power Processors", IEEE Journal Of Solid-State Circuits, vol. 37, No. 3, Mar. 2002, pp. 413-419.
Nose et al., "$V_{TH}$-Hopping Scheme For 82% Power Saving In Low-Voltage Processors", IEEE, 2001, 4 pgs.
Kuroda et al., "Substrate Noise Influence On Circuit Performance In Variable Threshold-Voltage Scheme", ISLPED, 1996, 6 pgs.
Kuroda et al., "A 0.9-V, 150-MHz, 10-mW, 4mm$^2$, 2-D Discrete Cosine Transform Core Processor With Variable Threshold-Voltage Scheme", IEEE International Solid-State Circuits Conference, Technical Papers, 1996, 14 pgs.
Anderson et al., "A Novel Low-Power FPGA Routing Switch", IEEE Custom Integrated Circuits Conference, 2004, 4 pgs.
Anderson et al., "Low Power Programmable Routing Circuitry For FPGAs", 8 pgs.
Inukai et al., "Variable Threshold Voltage CMOS In Series Connected Circuits", 29 pgs.
Roy, "Leakage: Estimation And Circuit Design Technique For Nano-Scale Technologies", 102 pgs.
Kuroda et al., "Overview Of Low-Power ULSI Circuit Technique", IEICE Trans. Electron., vol. E78-C, No. 4, Apr. 1995, 12 pgs.
Robenson, "Investigation Of A Dynamic Threshold Voltage Control Via Body Bulk-Biasing As A Fourth Terminal Of A CMOS Process Technology", University of Florida, Journal Of Undergraduate Research, http://web.clas.ufl.edu/CLAS/jur/0603/robensonpaper.html, Jun. 2003, 8 pgs.
Kobayashi et al, "Self-Adjusting Threshold-Voltage Scheme (SATS) For Low-Voltage High-Speed Operation", IEEE Custom Integrated Circuits Conference, May 1994, 5 pgs.
Burr et al, "A 200mV Self-Testing Encoder/Decoder Using Stanford Ultra-Low-Power CMOS", IEEE International Solid-State Circuits Conference, Digest Of Technical Papers, 1994, 3 pgs.
Hamada et al., "Utilizing Surplus Timing For Power Reduction", IEEE Custom Integrated Circuits Conference, 2001, pp. 89-92.
Kuroda, "Design With Multiple $V_{DD}$ Planes", ISSCC Workshop On Microprocessors, Feb. 2003, 36 pgs.
Kuroda, "CMOS Design Challenges To Power Wall", MNC, 2001, 58 pgs.
Martin et al, "Combined Dynamic Voltage Scaling And Adaptive Body Biasing For Lower Power Microprocessors Under Dynamic Workloads", ICCAD, Nov. 2002, 5 pgs.
Kuroda, "Optimization And Control For $V_{DD}$ And $V_{TH}$ For Low-Power, High-Speed CMOS Design", IEEE, 2002, 7 pgs.
Kuroda, "Low-Power, High-Speed CMOS VLSI Design", IEEE International Conference On Computer Design: VLSI In Computers And Processors, 2002, 6 pgs.
Najm, "State Dependence And Sleep States; Memory/Cache Circuits And Architectures", ICCAD, 2003, 67 pgs.
Anderson et al., "Low-Power Programmable Routing Circuitry For FPGAs", IEEE, 2004, 8 pgs.
Borkar et al., "Parameter Variations And Impact On Circuits And Microarchitecture", Circuit Research, Intel Labs, 14 pgs.
Narendra et al., "Forward Body Bias For Microprocessors In 130-nm Technology Generation And Beyond", IEEE Journal Of Solid-States Circuits, vol. 38, No. 5, May 2003, pp. 696-701.
Augsburger et al, "Combining Dual-Supply, Dual-Threshold And Transistor Sizing For Power Reduction", 6 pgs.
Kuroda, "Power-Aware Electronics: Challenges And Opportunities Unit 4: Design With Multiple $V_{DD}/V_{TH}$ Planes", FTFC Tutorial, May 14, 2003, 30 pgs.
Kuroda, paper in ISSCC 2002, 54 pages.
Kuroda, "Power-Aware Electronics: Challenges And Opportunities Unit 5: Variable $V_{DD}/V_{TH}$ Design Techniques", FTFC Tutorial, May 14, 2003, 38 pages.
Kuroda, "10 Tips For Low Power CMOS Design", 40th DAC Tutorial 1 "Design Techniques For Power Reduction", Jun. 2, 2003, 72 pgs.

* cited by examiner ical amplifier for use in a regulator of the type shown in FIG. 10 in accordance with the present invention.

ADJUSTABLE TRANSISTOR BODY BIAS CIRCUITRY

This application is a continuation of patent application Ser. No. 11/369,664, filed Mar. 6, 2006, now U.S. Pat. No. 7,495,471 which is hereby incorporated by referenced herein in its entirety.

BACKGROUND

This invention relates to transistor body bias circuits, and more particularly, to adjustable transistor body bias circuits for integrated circuits such as programmable logic devices.

The performance of modern integrated circuits is often limited by power consumption considerations. Circuits with poor power efficiency place undesirable demands on system designers. Power supply capacity may need to be increased, thermal management issues may need to be addressed, and circuit designs may need to be altered to accommodate inefficient circuitry.

Integrated circuits often use complementary metal-oxide-semiconductor (CMOS) transistor technology. CMOS integrated circuits have n-channel metal-oxide-semiconductor (NMOS) and p-channel metal-oxide-semiconductor (PMOS) transistors.

NMOS and PMOS integrated circuits have four terminals—a drain, a source, a gate, and a body. The body terminal, which is sometimes referred to as the well or bulk terminal, can be biased to improve transistor performance. For example, a positive bias voltage can be applied to the body of a PMOS transistor and a negative bias voltage can be applied to the body of an NMOS transistor. These bias voltages increase the effective threshold voltages of the transistors and thereby reduce their leakage currents. Reductions in leakage current reduce power consumption.

Suitable bias voltages tend to be a small. For example, an NMOS body bias voltage may be less than a few hundred millivolts. Larger body bias voltages can be used to reduce leakage current further, but can have a significant adverse impact on device performance. The optimum balance between reduced leakage current and sacrificed performance is generally obtained using small body bias voltages.

Body bias voltages can be generated off chip, but this type of approach consumes scarce input-output pins. Moreover, body bias voltage sources that are not adjustable can create problems in programmable logic devices, where it is often desirable to vary the amount of bias that is used.

It would therefore be desirable to provide adjustable on-chip transistor body bias voltage circuitry for reducing power consumption on integrated circuits such as programmable logic device integrated circuits.

SUMMARY

In accordance with the present invention, an integrated circuit such as a programmable logic device integrated circuit is provided that contains adjustable body bias circuitry. The adjustable body bias circuitry is controlled by control signals. The control signals may be provided from programmable elements that have been loaded with configuration data, may be provided by programmable logic on the integrated circuit, or may be obtained from an external source. A decoder may be used to decode undecoded control signals.

The adjustable body bias circuitry may contain a charge pump circuit that produces a negative voltage, an adjustable voltage regulator that produces an adjustable negative body bias voltage using the negative voltage, and a bandgap reference circuit that provides reference signals for the adjustable regulator and charge pump circuit.

The adjustable voltage regulator may contain an adjustable voltage divider, a transistor that is connected between the charge pump circuit and the adjustable voltage divider, and an operational amplifier. The adjustable voltage divider may contain a chain of series-connected resistors and a number of transistors that are connected between respective pairs of the series-connected resistors. The control signals for the adjustable body bias circuit may be applied to the gates of the transistors to define a desired voltage divider voltage tap location. The operational amplifier receives a reference voltage from the bandgap reference circuit at one input and receives signals that are fed back from the voltage divider tap point at another input. The operational amplifier has an output that is applied to the gate of the transistor that is connected to the charge pump circuit. The magnitude of the negative body bias voltage produced by the adjustable voltage regulator is controlled by adjusting the voltage divider.

Further features of the invention, its nature and various advantages will be more apparent from the accompanying drawings and the following detailed description.

DETAILED DESCRIPTION

The present invention relates to adjustable body bias voltage sources. The body bias voltage sources may be used on any suitable integrated circuit. With one particularly suitable arrangement, adjustable body bias circuitry in accordance with the invention is used on a programmable logic device integrated circuit. The body bias circuitry can also be used on integrated circuits with programmable circuitry that are not traditionally referred to as programmable logic devices such as microprocessors containing programmable circuitry, digital signal processors containing programmable circuitry, custom integrated circuits with programmable circuits, etc. The present invention is generally described in the context of programmable logic device integrated circuits as an example.

Programmable logic device integrated circuits can be customized using configuration data. In a typical scenario, a logic designer uses a computer-aided design (CAD) system in designing a desired logic circuit. The computer-aided design system uses information on the hardware capabilities of a programmable logic device to generate configuration data.

Programmable logic devices contain programmable elements. The programmable elements may be based on any suitable programmable technology such as fuses, antifuses, laser-programmed elements, electrically-programmed elements, non-volatile memory elements, volatile memory elements, mask-programmed elements, etc. In a typical scenario, which is described herein as an example, the programmable elements are based on random-access memory (RAM) cells.

To customize programmable logic devices to implement the desired logic circuit, the configuration data produced by the computer-aided design system is loaded into the programmable memory elements. During operation of the programmable logic device, each memory element provides a static output signal based on its loaded configuration data. The outputs signals from the memory elements are applied to n-channel and p-channel metal-oxide-semiconductor transistors in regions of programmable logic on the programmable logic device. This configures the programmable logic of the device so that the programmable logic device implements the desired logic circuit.

In accordance with the present invention, a programmable logic device is provided with adjustable body bias circuits. A p-channel body bias circuit generates a body bias voltage for p-channel metal-oxide-semiconductor transistor on the programmable logic device. An n-channel body bias circuit generates a body bias voltage for n-channel metal-oxide-semiconductor transistors on the programmable logic device. The body bias voltages reduce transistor leakage and thereby improve device performance.

Figure 1:
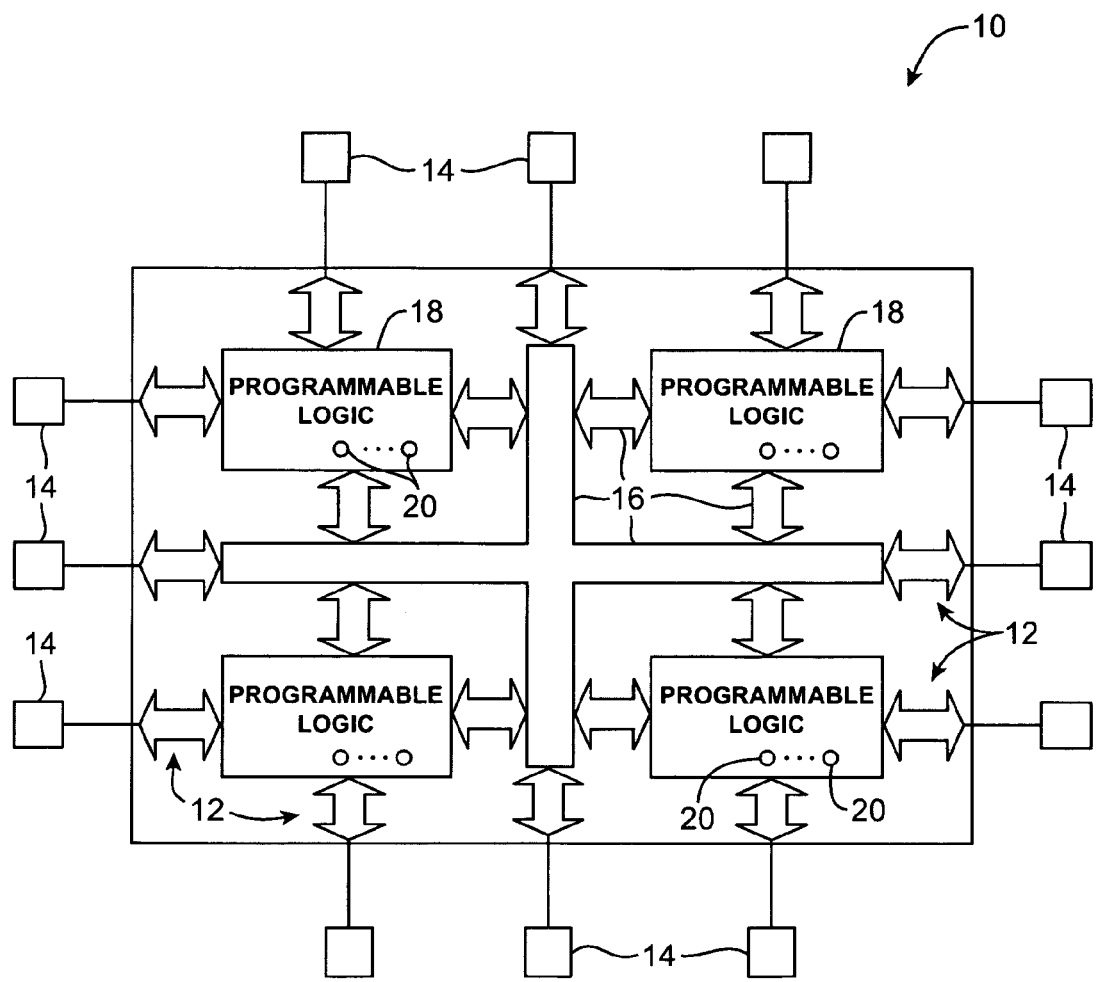
FIG. 1 is a diagram of an illustrative programmable logic device integrated circuit in accordance with the present invention.

An illustrative programmable logic device 10 in accordance with the present invention is shown in FIG. 1. Programmable logic device 10 has input-output circuitry 12 for driving signals off of device 10 and for receiving signals from other devices via input-output pins 14. Interconnection resources 16 such as global and local vertical and horizontal conductive lines and busses are used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources 16 may be considered to be a part of programmable logic 18.

Programmable logic device 10 contains programmable elements 20 such as random-access memory cells that can be loaded with configuration data (also called programming data) using pins 14 and input-output circuitry 12. Once loaded, the programmable elements each provide a corresponding static control output signal that controls the state of an associated logic component in programmable logic 18. The programmable element output signals are used to control the gates of metal-oxide-semiconductor (MOS) transistors. Most of these transistors are generally n-channel metal-oxide-semiconductor (NMOS) pass transistors in programmable components such as multiplexers, look-up tables, logic arrays, AND, OR, NAND, and NOR logic gates, etc. When a programmable element output is high, the pass transistor controlled by that programmable element is turned on and passes logic signals from its input to its output. When the programmable element output is low, the pass transistor is turned off and does not pass logic signals.

The programmable elements may be loaded from any suitable source. In a typical arrangement, the programmable elements are loaded from an external erasable-programmable read-only memory and control chip called a configuration device via pins 14 and input-output circuitry 12.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

The transistors on device 10 have four terminals—a source, a drain, a gate, and a body. The body terminal, which is also sometimes referred to as a well terminal or a bulk terminal, can be biased to reduce power consumption. In p-channel metal-oxide-semiconductor transistors, the body terminal voltage can be elevated slightly with respect to the positive power supply voltage (sometimes called Vcc). In n-channel metal-oxide-semiconductor transistors, the body terminal voltage can be lowered somewhat relative to ground (sometimes referred to as Vss). For example, if Vss is 0 volts, the body terminal of an n-channel metal-oxide-semiconductor transistor can be biased at a negative voltage having a magnitude in the range of about 0 to 500 mV or 0 to 1000 mV (e.g., 100 mV, 200 mV, 300 mV, etc.).

Figure 2:
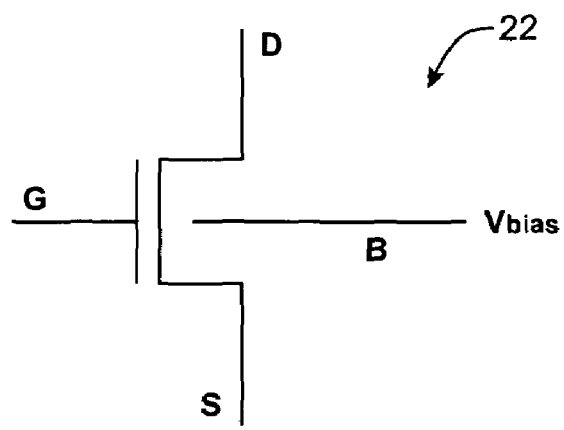
FIG. 2 is a schematic diagram of a body biased n-channel metal-oxide-semiconductor transistor in accordance with the present invention.
Figure 3:
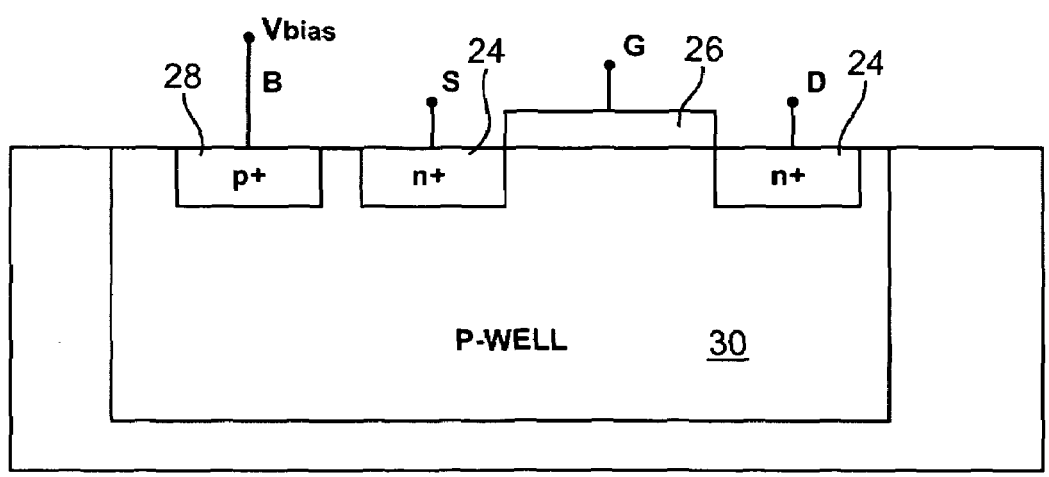
FIG. 3 is a cross-sectional view of a body biased n-channel metal-oxide-semiconductor transistor in accordance with the present invention.

A schematic diagram of an illustrative n-channel metal-oxide-semiconductor transistor 22 is shown in FIG. 2. The source of transistor 22 is labeled S, the drain is labeled D, the gate is labeled G, and the body is labeled B. As shown in FIG. 2, a body bias voltage Vbias is applied to body terminal B. A cross-sectional diagram of the n-channel transistor 22 of FIG. 2 is shown in FIG. 3. Source S and drain D are formed using implant regions 24. Gate structure 26 is formed from a thin layer of insulator such as silicon oxide and a gate conductor such as silicided polysilicon. Body terminal B uses implant region 28 to form an ohmic contact with p-type body region 30.

The adjustable body bias circuitry of the present invention can generate stable and accurate negative bias voltages having magnitudes of tens or hundreds of millivolts (or more). These negative bias voltages can be used to bias n-channel transistors such as transistor 22 of FIGS. 2 and 3 to reduce power consumption. In general, any suitable number of transistors may be provided with a body bias. For example, some or all of the n-channel transistors on the device 10 may be provided with a body bias and some or all of the p-channel transistors may be provided with a body bias. An advantage to providing extensive body biasing is that the power consumption of the device 10 will be minimized. An advantage of using body biasing selectively is that performance can be optimized. For example, body biasing can be avoided (or reduced) in critical signal paths where maximum performance is desired.

Decisions regarding which circuitry on the device 10 is to be provided with body biasing and the amount of biasing to use may be made by the logic designer or CAD tool during the design process. Based on these decisions, the CAD tool can generate configuration data for adjusting the adjustable body bias circuitry. Once loaded into the programmable logic device, the configuration data can be used to selectively turn biasing on and off for various portions of the device 10 and to adjust the amount of biasing that is used for various portions of the device 10 (e.g., to maximize performance in some portions of the device 10 and to maximize power consumption savings in other portions of the device 10). In general, any suitable number of different body bias voltages may be produced on a given programmable logic device. The production of a single body bias voltage for biasing n-channel metal-oxide-semiconductor transistors is described as an example.

Figure 4:
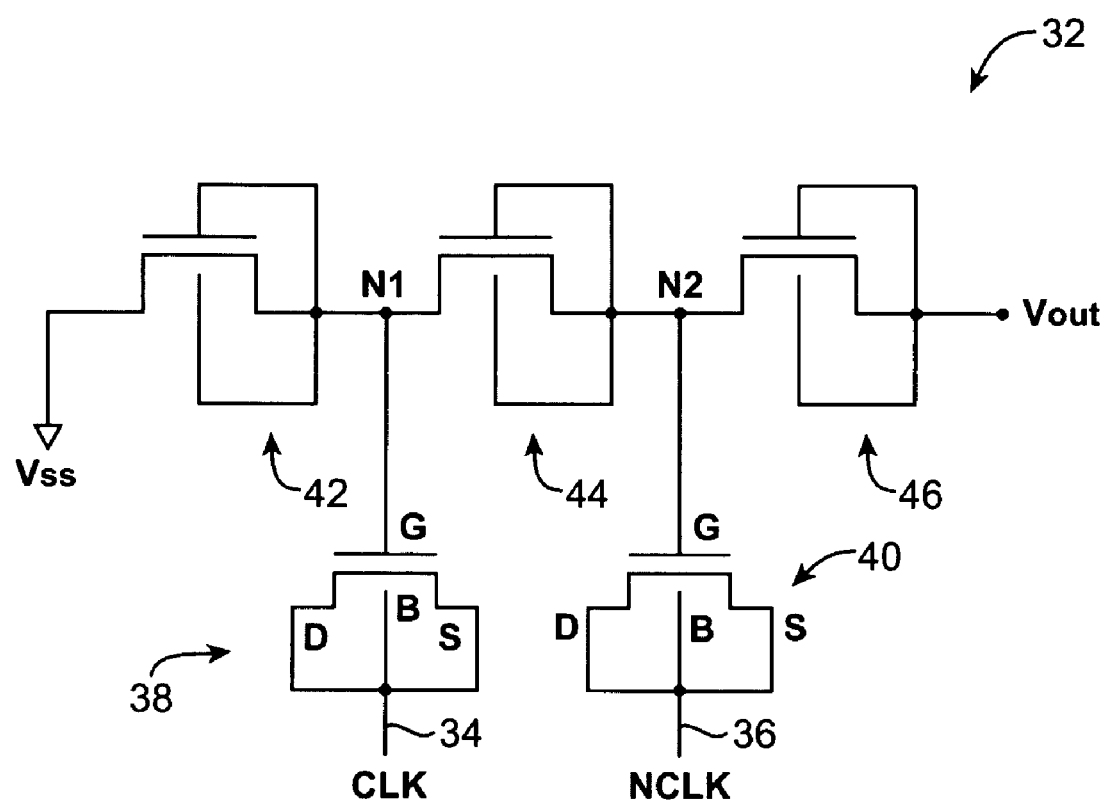
FIG. 4 is a schematic diagram of an illustrative charge pump in accordance with the present invention.

A negative body bias voltage Vbias is used to bias n-channel metal-oxide-semiconductor transistors. In a typical scenario, the ground voltage Vss of device 10 is 0 volts. A charge pump 32 of the type shown in FIG. 4 can be used to generate a voltage Vout that is negative with respect to Vss (i.e., a voltage that is less than 0 volts). The charge pump 32 that is shown in the example of FIG. 4 is a two-stage pump. This is merely illustrative. Charge pump 32 may have any suitable number of stages (e.g., three or more stages).

As shown in FIG. 4, clock signal CLK and its inverse NCLK, are applied to terminals 34 and 36 respectively. Capacitors 38 and 40 are metal-oxide-semiconductor transistor capacitors (sometimes referred to as MOS capacitors) that are formed from MOS transistor structures. The capacitor dielectrics in capacitors 38 and 40 are formed from the gate insulators in the MOS transistor structures. One electrode of each capacitor is formed from a transistor gate terminal. The other electrode of each capacitor is formed from the drain, source, and body terminals, which are electrically connected, as shown in FIG. 4. The use of MOS capacitors in charge pump 32 is advantageous, because MOS capacitors are readily available on device 10 and do not require special processing steps during the semiconductor manufacturing process.

Figure 5:
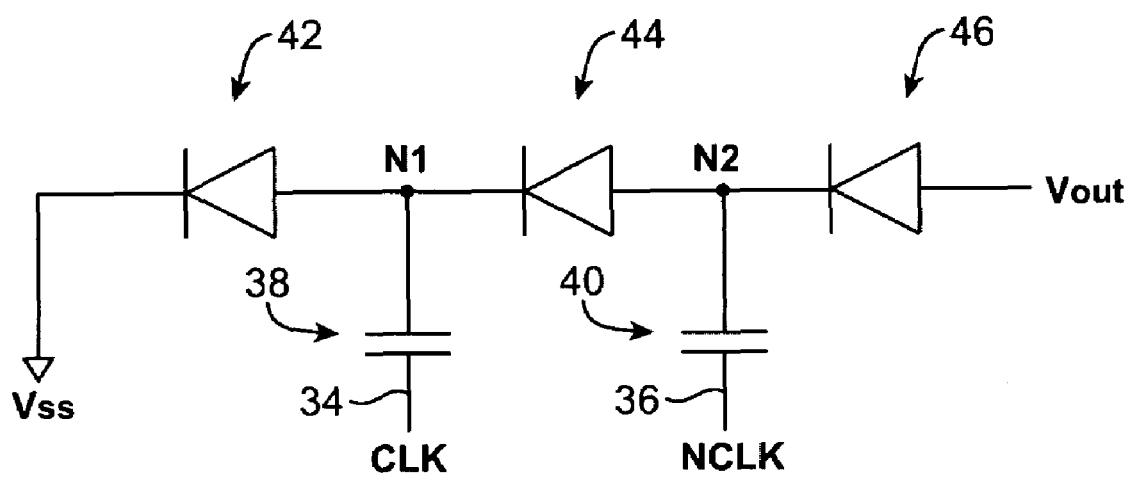
FIG. 5 is a simplified schematic diagram of the charge pump of FIG. 4.

Charge pump 32 has three transistors with terminals that are connected to form diodes 42, 44, and 46. Other diode structures may be used to form diodes 42, 44, and 46 if desired. A circuit diagram for the charge pump 32 of FIG. 4 in which diodes 42, 44, and 46 are represented using diode symbols and in which MOS transistor capacitors 38 and 40 are represented using capacitor symbols is shown in FIG. 5.

Figure 6:
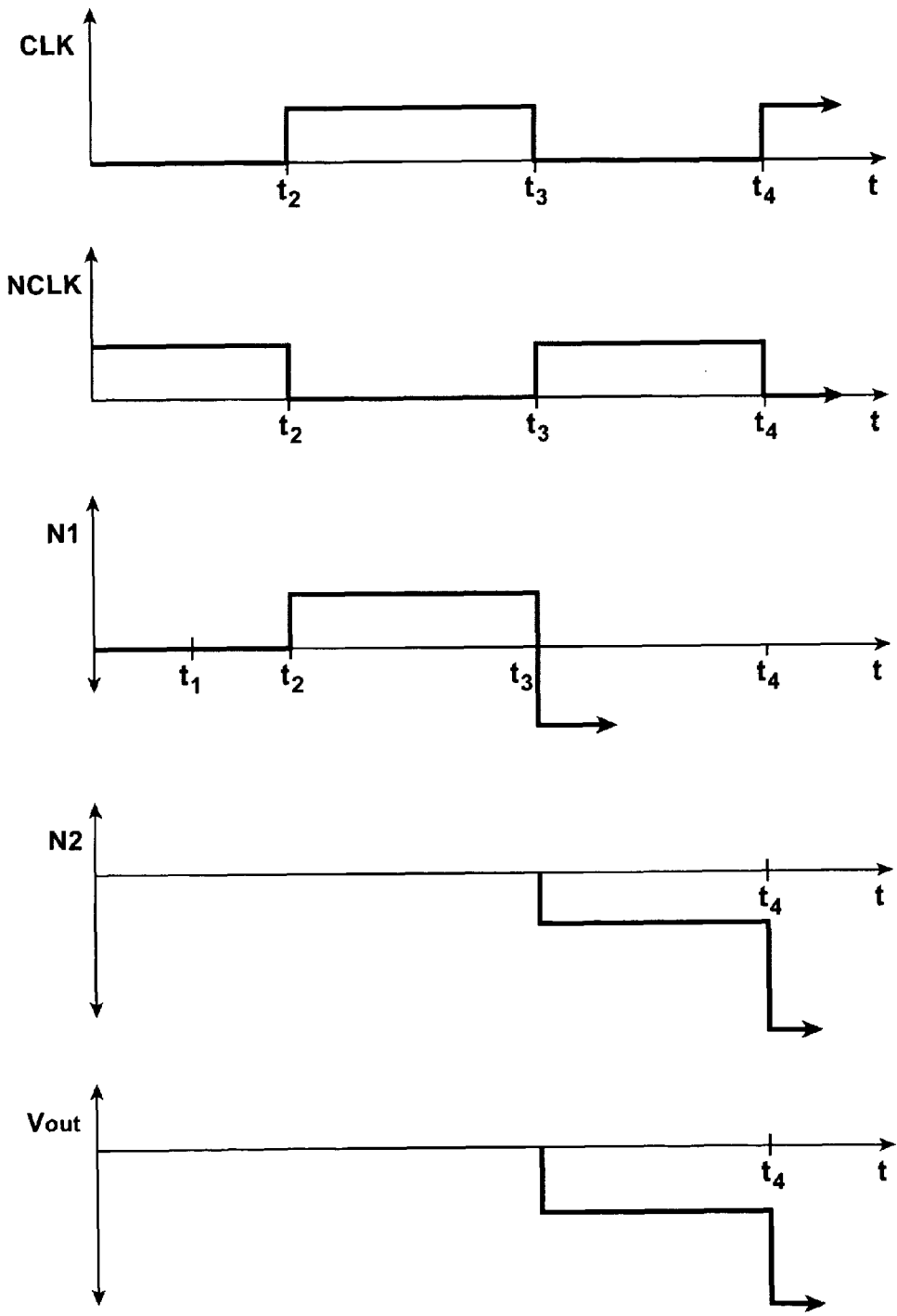
FIG. 6 is a timing diagram showing how a charge pump of the type shown in FIGS. 4 and 5 generates negative output voltages for use in transistor body biasing in accordance with the present invention.

The operation of charge pump 32 is shown in the timing diagram of FIG. 6. The clock signals CLK and NCLK are shown in the first and second traces of FIG. 6. The voltages on nodes N1 and N2 are shown in the third and fourth traces of FIG. 6. The fifth trace of FIG. 6 shows the voltage Vout at the charge pump output.

Initially, at time t1, the voltage on node N1 of charge pump 32 is at 0 volts, as shown by the third trace of FIG. 6. At time t2, the clock signal CLK goes high and its inverse NCLK goes low. During the rise in the signal CLK at time t2, the voltage across capacitor 38 does not change. As a result, the voltage at node N1 rises at time t2. The rise in the voltage at node N1 turns on diode 42. The maximum rise in the voltage at node N1 is capped at the turn-on voltage of diode 42 (about 0.6 volts or one transistor threshold voltage Vt), which is less than the magnitude of CLK.

At time t3, the signal CLK goes low and the signal NCLK goes high. The voltage across capacitor 38 does not change during the signal transitions at time t3, so the drop in signal CLK causes the voltage on node N1 to drop, as shown in the third trace of FIG. 6. The voltage at node N2 is one diode turn-on voltage (about 0.6 volts or one transistor threshold voltage Vt) higher than the voltage at node N1, because diode 44 is turned on.

At time t4, the signal CLK goes high and the signal NCLK goes low. The voltage across capacitor 40 does not change during the transitions at time t4, so the voltage at node N2 drops at time t4, tracking the drop in the NCLK signal on terminal 36. This forces the voltage Vout on the output terminal of charge pump 32 low, as shown in the fifth trace of FIG. 6. The voltage Vout is one diode turn-on voltage higher than the voltage at N2, because diode 46 is turned on.

As this discussion illustrates, the charge pump 32 of FIGS. 4 and 5 produces a negative voltage Vout at its output.

The number of stages in the charge pump and the sizes of the clock signals affect the size of the negative output voltage Vout. Moreover, the clock signals CLK and NCLK can be selectively enabled and disabled to regulate the output voltage Vout. However, using a charge pump alone to produce the bias voltage Vbias (i.e., using Vout as Vbias) is not generally preferred, because of the voltage dependent properties of the charge pump MOS capacitors 38 and 40.

Figure 7:
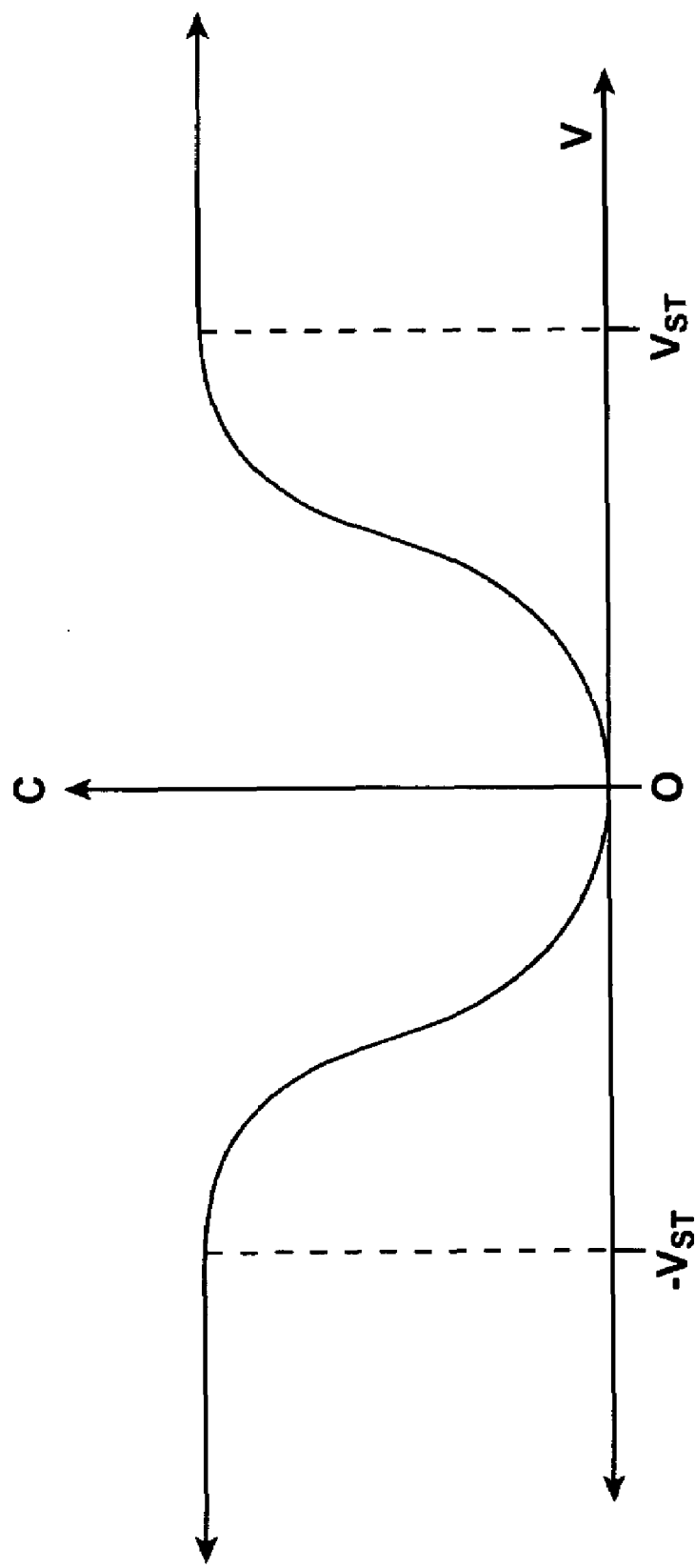
FIG. 7 is a diagram showing how the capacitance of metal-oxide-semiconductor transistor capacitors varies as a function of applied voltage.

MOS capacitors such as MOS capacitors 38 and 40 typically exhibit a capacitance C having a voltage dependence of the type shown in FIG. 7. At voltages of greater than Vst or less than −Vst, the capacitance C is relatively constant. In this regime, the charge pump will behave predictably and, with appropriate regulation, will be able to generate a stable and accurate output voltage Vout. At capacitor voltages between −Vst and Vst, the capacitance C changes significantly as a function of applied voltage. In this regime, the operation of the charge pump 32 tends to be unstable. It is therefore advisable to avoid operating charge pump 32 under conditions in which the voltages across the capacitors 38 and 40 are between −Vst and Vst.

On a given programmable logic device, the value of Vst depends on the type of MOS structure that is formed. In general, the value of Vst is approximately equal to one or two transistor threshold voltages Vt (i.e., Vst is approximately 1 volt on integrated circuits having Vt values of about 0.6 volts). The voltage levels needed for Vbias tend to be between about 0 volts and −1 volt, whereas the charge pump of FIGS. 4 and 5 is not well suited to generating stable voltages in this voltage range. As a result, it is generally not desirable to use the charge pump of FIGS. 4 and 5 to directly generate the voltage Vbias.

In accordance with the present invention, a charge pump of the type shown in FIGS. 4 and 5 is provided with voltage divider and feedback circuitry, which makes it possible to generate a stable and accurate voltage Vbias for biasing n-channel metal-oxide-semiconductor transistors on device 10. The charge pump produces a stable voltage Vout (called Vneg), of about −1 V (as an example). The voltage divider reduces the size of Vneg to produce Vbias values of tens or hundreds of mV. These Vbias values fall within the range typically needed to bias n-channel transistors to reduce power consumption without adversely affecting transistor performance.

Figure 8:
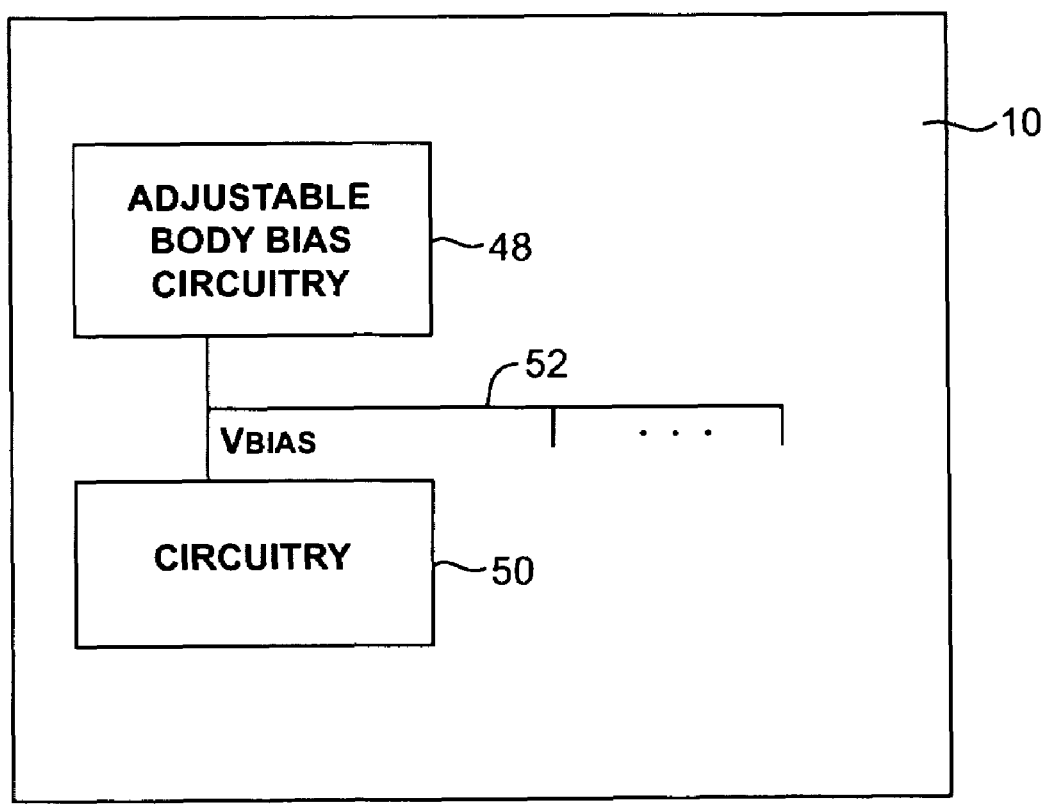
FIG. 8 is a circuit diagram of an illustrative adjustable body bias circuit arrangement that may be used to bias transistors in an integrated circuit such as a programmable logic device integrated circuit in accordance with the present invention.

An adjustable body bias circuit arrangement in accordance with the present invention is shown in FIG. 8. As shown in FIG. 8, programmable logic device integrated circuit 10 contains on-chip adjustable body bias circuitry 48. Body bias circuitry 48 produces an adjustable body bias output voltage Vbias at its output. Conductive paths such as paths 52 are used to distribute Vbias to the body terminals of appropriate n-channel transistors (shown schematically as circuitry 50 in FIG. 8). There may be any suitable number of adjustable body bias generators on programmable logic device 10, each of which may produce a different corresponding value of Vbias.

Figure 9:
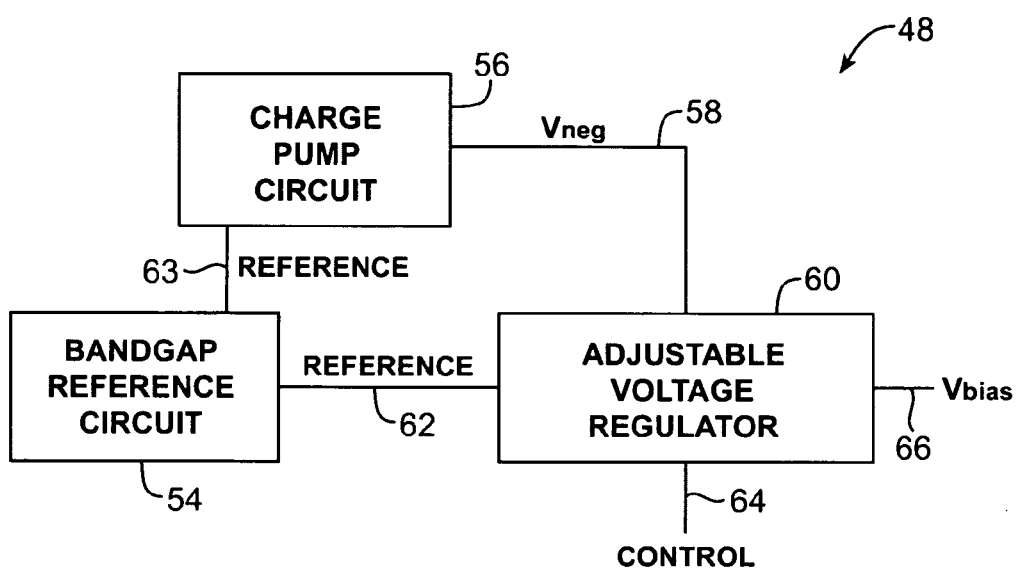
FIG. 9 is a circuit diagram of illustrative adjustable body bias circuitry having a charge pump, bandgap reference circuit, and adjustable regulator in accordance with the present invention.

The adjustable body bias circuitry 48 may be implemented using a charge-pump-based circuit of the type shown in FIG. 9. In the example of FIG. 9, adjustable body bias circuitry 48 has a charge pump circuit 56, a bandgap reference circuit 54, and an adjustable voltage regulator 60. Circuitry 48 produces an adjustable negative output voltage Vbias at its output 66. The voltage Vbias that is produced at output 66 is applied to the body terminals of n-channel metal-oxide-semiconductor transistors via paths such as paths 52 (FIG. 8).

Bandgap reference circuit 54 produces reference signals that are supplied to adjustable regulator 60 via path 62 and that are supplied to charge pump circuit 56 via path 63. Adjustable regulator 60 and charge pump circuit 56 use the reference signals in producing stable output signals.

Charge pump circuit 56 produces a negative charge pump output voltage Vneg, which is provided to adjustable regulator 60 via path 58. The magnitude of Vneg is preferably greater than the largest magnitude desired for Vbias. For example, if the strongest value of Vbias that is needed is −0.9 volts, then Vneg is preferably about −0.9 volts or lower (e.g., −1.0 volts, −1.2 volts, etc.).

Adjustable voltage regulator 60 is controlled by control signals (shown schematically in FIG. 9 as control signals CONTROL received at control input 64). The control signals are used to determine the magnitude of the bias voltage Vbias produced at output 66. The control signals may be used, for example, to set the bias voltage Vbias to −100 mV, to −200 mV, or any other suitable bias level.

Figure 10:
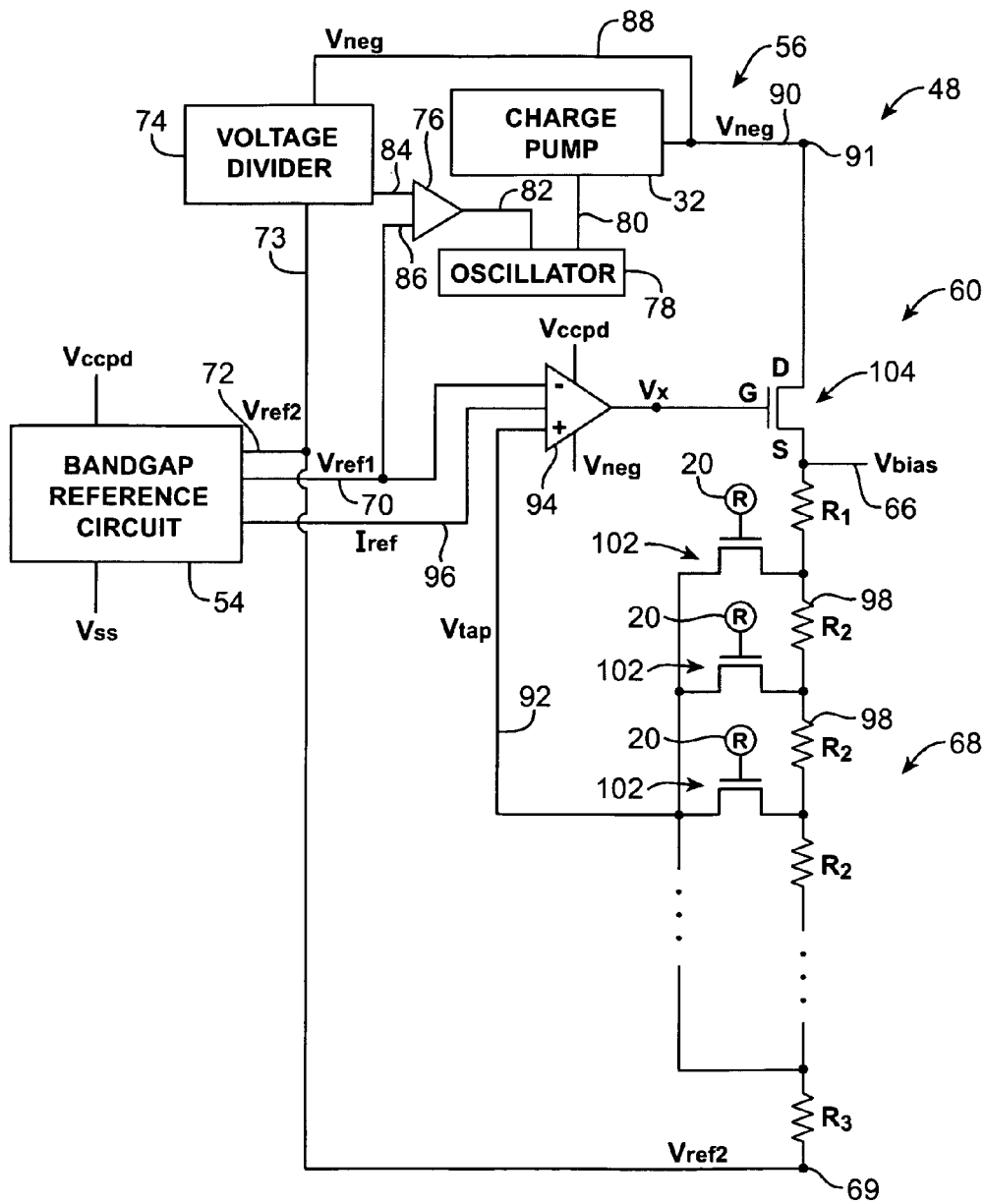
FIG. 10 is a circuit diagram of illustrative adjustable body bias circuitry having a regulator based on a programmable voltage divider in accordance with the present invention.

The adjustable voltage regulator 60 and charge pump circuit 56 may be implemented using any suitable circuitry. One suitable arrangement is shown in FIG. 10. In the illustrative arrangement of FIG. 10, bandgap reference circuit 54 is powered by a positive power supply voltage Vccpd and a ground voltage Vss. Power supply voltage Vccpd may be, for example, about 2.5 volts. Power supply voltage Vccpd is preferably obtained from a preexisting power supply line to avoid unnecessarily increasing the complexity of the programmable logic device 10. Power supply voltage Vccpd may, as an example, be the same power supply voltage that is used to power driver circuitry in input-output circuits 12 of FIG. 1.

The bandgap reference circuit 54 supplies reference voltages Vref1 and Vref2 on corresponding output lines 70 and 72. The particular values chosen for Vref1 and Vref2 are not critical. An example of a suitable Vref1 value is 0.5 volts. An example of a suitable Vref2 value is 1 volt (twice Vref1). The bandgap reference circuit 54 also supplies a reference current Iref. Iref may be, for example, 10 μA.

Charge pump circuit 56 includes a charge pump 32, a voltage divider 74, a comparator 76, and an oscillator 78. Oscillator 78 provides the clock signals CLK and NCLK to charge pump 32 over path 80. The output produced by comparator 76 on line 82 controls the oscillator 78. The output of charge pump 32 is the voltage Vneg and is provided to voltage regulator 60 via path 90. The voltage Vneg is also fed back to the voltage divider 74 via feedback path 88. The voltage divider 74 uses Vneg and Vref2 (received at input 73) to produce an output signal on line 84 that is proportional to the voltage Vneg that has been fed back via line 88. The reference voltage Vref1 is supplied to comparator 76 via path 86.

Comparator 76 compares the signals on lines 84 and 86 and generates a corresponding output on path 82. When the signal on line 84 is greater than the signal on line 86, the output of comparator 76 on line 82 is high. This turns the oscillator 78 on and causes the charge pump 32 to drive Vneg lower. When the signal on line 84 is less than the signal on line 86, the output of comparator 76 on line 82 is low. This turns off oscillator 78, signaling that Vneg has reached its desired value. Using this feedback arrangement, the value of Vneg is held constant at its desired value (e.g., −1 volts).

The voltage Vneg is supplied to adjustable regulator 60 via path 90 and forms its negative power supply. The voltage Vref2 serves as the positive power supply for the adjustable voltage regulator 60. Adjustable voltage regulator 60 has an adjustable voltage divider 68 that is formed from a number of series-connected resistors 98. Typical resistor values are about 10 kΩ to 50 kΩ. One end of the resistor chain in voltage regulator 60 is maintained at a voltage Vbias. The other end of the resistor chain connected to the positive power supply Vref2.

A voltage Vtap is tapped off of the resistor chain in the voltage divider. Regulator 60 has a feedback path 92 that provides the voltage Vtap to one of the inputs of operational amplifier 94. The magnitude of the voltage Vtap is determined by the state of the adjustable voltage divider. By adjusting the point at which the voltage Vtap is tapped from the series-connected resistors 98, the voltage set-point for the voltage divider can be adjusted.

In the illustrative arrangement of FIG. 10, the voltage tap point location in the series-connected resistors of the voltage divider is established by setting the states of programmable elements 20. Each programmable element 20 controls a corresponding transistor 102. The state of each programmable element is determined by its content. During device programming, configuration data is loaded into programmable elements 20. Programmable elements that are loaded with logic zeros produce low output signals and turn off their associated transistors 102. One of the programmable elements is loaded with a logic one. The logic one in the programmable element causes the output of that programmable element to go high. The high output signal turns on a corresponding transistor

102. The location at which the transistor 102 is turned on determines the set point for the voltage divider 68.

The voltage Vtap from the voltage divider 68 is fed back to the operational amplifier 94 via feedback path 92. Operational amplifier 94 is powered using suitable power supply voltages (e.g., voltage Vccpd and Vneg in the example of FIG. 10). The operational amplifier 94 preferably receives reference signals from bandgap reference circuit 54 such as current reference Iref and voltage reference Vref1. The current reference Iref is provided to operational amplifier 94 via input line 96. The voltage reference signal Vref1 is applied to an input terminal of the operational amplifier 94.

The operational amplifier 94 compares the tapped voltage Vtap from the voltage divider 68 to the reference voltage Vref1 and produces a corresponding output control signal Vx. The signal Vx is applied to the gate G of transistor 104. Transistor 104 is normally on and operates in saturation. Current flows from Vref2 node 69 (at 1 V) to Vneg node 91 (at −1 V) through the resistors of the voltage divider 68 and the source and drain of transistor 104. When Vx rises, the amount of current that transistor 104 is conducting between its source and drain also rises. This causes a drop in the voltage Vbias at output terminal 66. When Vx falls, the amount of current passing through transistor 104 falls, raising Vbias.

The feedback loop from the voltage divider 68 through the operational amplifier 94 accurately maintains the voltage Vbias at its desired level. If Vbias begins to rise slightly above its set point (e.g., by rising from −100 mV to −99 mV), Vtap will rise slightly (e.g., from 500 mV to 501 mV). The feedback provided by path 92 causes the output of operational amplifier 94 to increase, so the voltage Vx at the output of operational amplifier 94 will rise. In response to the increased value of Vx, the current through transistor 104 and will increase. Increasing the current through transistor 104 will cause Vbias to fall (e.g., from −99 mV to −100 mV) back towards its desired set point value (−100 mv in this example). If Vbias begins to fall slightly below its set point, feedback through path 92 will cause Vbias to rise (e.g., from −101 mV to −100 mV).

The number of resistors 98 that are used in voltage divider 68 is determined by the desired number of voltage steps for adjustable voltage regulator 60. If a large number of resistors 98 are used, there will be a relatively large number of voltage steps and voltage regulator 60 will be able to produce desired Vbias levels with a high level of precision. If fewer resistors 98 are used, each voltage step will be larger and less precision will be available, but circuit complexity will be reduced. In general, any suitable number of resistors 98 and associated tap transistors 102 may be used in voltage divider 68.

Figure 11:
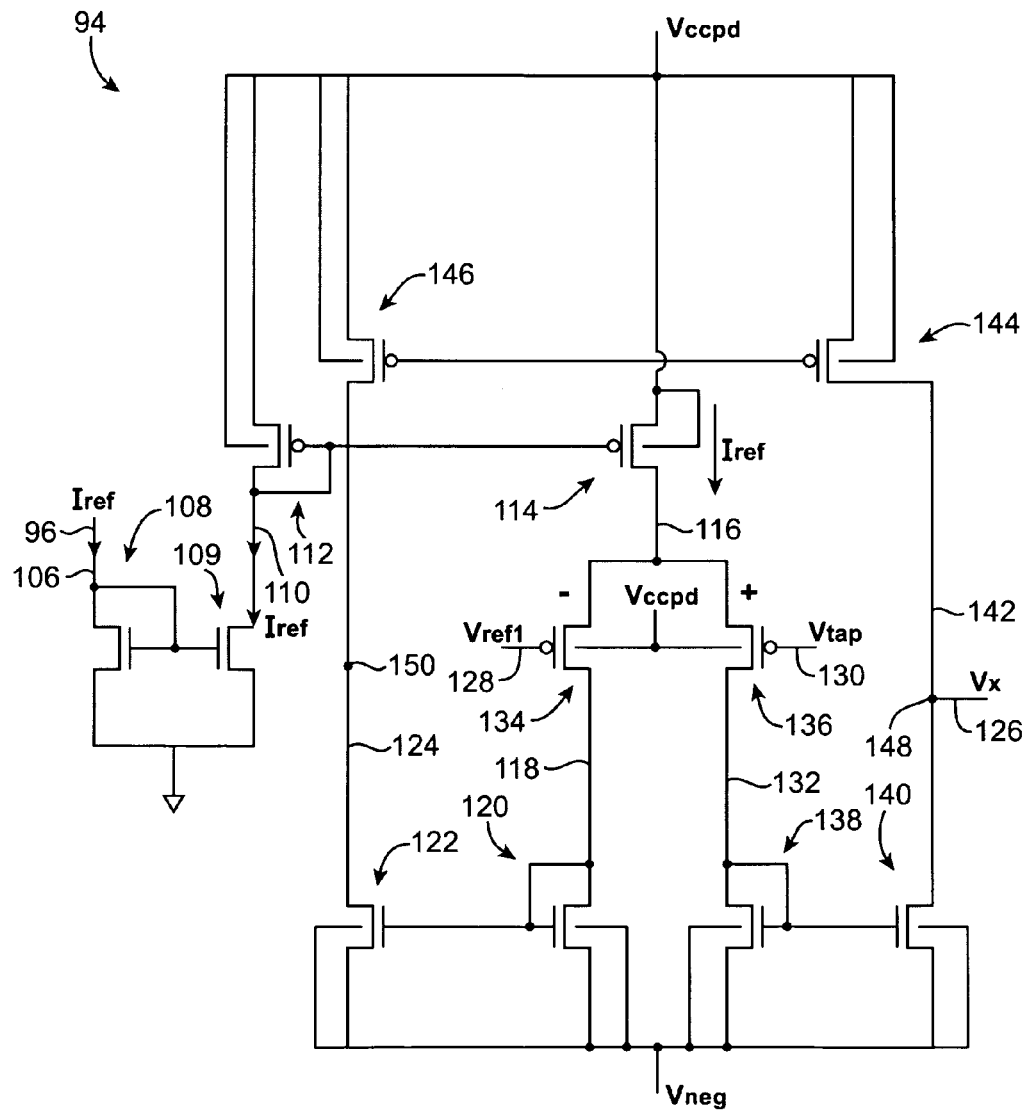
FIG. 11 is a circuit diagram of an illustrative operational amplifier for use in a regulator of the type shown in FIG. 10 in accordance with the present invention.

Illustrative circuitry that may be used for operational amplifier 94 of FIG. 10 is shown in FIG. 11. As shown in FIG. 11, operational amplifier 94 is powered using positive power supply voltage Vccpd and negative voltage supply Vneg. The output 126 of operational amplifier 94 produces the voltage Vx that is applied to the gate of transistor 104 (FIG. 10).

The reference current Iref is applied to input 106 from line 96. Transistors 108 and 109 form a current mirror, so a current of magnitude Iref flows through path 110. Transistors 112 and 114 also form a current mirror, so current Iref flows through path 116. The current mirrors in FIG. 11 have a mirror ratio of 1, because their transistors have equal strength. If desired, current mirrors with other mirror ratios may be used.

Negative input 128 and positive input 130 receive voltage Vref1 and voltage Vtap, respectively. The reference Vref1 is produced by the bandgap reference circuit 54 (FIG. 10) and is constant. The value of Vtap fluctuates slightly above and below Vref1, as Vbias fluctuates slightly around its desired set point value. The value of Vtap relative to the reference value Vref1 determines whether current is steered through path 118 or path 132.

When Vtap is greater than Vref1, p-channel metal-oxide-semiconductor transistor 134 is turned on more strongly than p-channel metal-oxide-semiconductor transistor 136. This causes relatively more of the current Iref in path 116 to be steered into path 118 than into path 132. Transistors 120 and 122 form a current mirror, so the additional current steered into path 118 causes additional current to be steered into path 124.

When Vtap is less than Vref1, current is steered into path 132. Transistors 138 and 140 form a current mirror, so the additional current steered into path 132 causes more current to be steered into path 142. In steady state, the value of Vtap settles to Vref1 and equal amounts of current flow through the left-hand and right-hand branches of operational amplifier 94.

Transistors 146 and 144 are load transistors that convert the current flowing through paths 124 and 142 into voltages at nodes 150 and 148, respectively. When the current through path 142 increases due to a decrease in Vtap at terminal 130, the voltage Vx falls. When the current through path 142 decreases due to an increase in the value of Vtap at terminal 130, the voltage Vx rises.

In the example of FIG. 10, the setting of the voltage divider circuit 68 is adjusted using configuration data loaded into programmable elements 20. In this type of situation, the outputs of the programmable elements 20 serve as the control signals for the adjustable regulator 60 (shown as CONTROL signals on path 64 in FIG. 9). This type of arrangement is merely illustrative. Any suitable technique for controlling the voltage divider 68 and voltage regulator 60 may be used if desired. For example, other techniques may be used to supply control signals to the voltage tap transistors 102.

Illustrative arrangements for controlling transistors 102 are shown in FIGS. 12, 13, 14, and 15.

Figure 12:
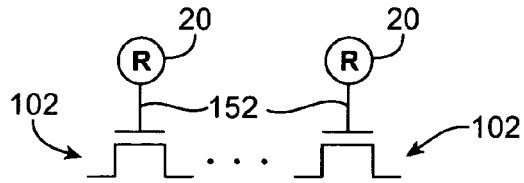
FIG. 12 is a diagram showing how each transistor in the programmable voltage divider of FIG. 10 may be controlled by a respective programmable element in accordance with the present invention.

In the arrangement of FIG. 12, a single programmable element 20 is associated with each transistor 102. The outputs of the programmable elements 20 are provided to the gates of the transistors 102 using respective control lines 152.

Figure 13:
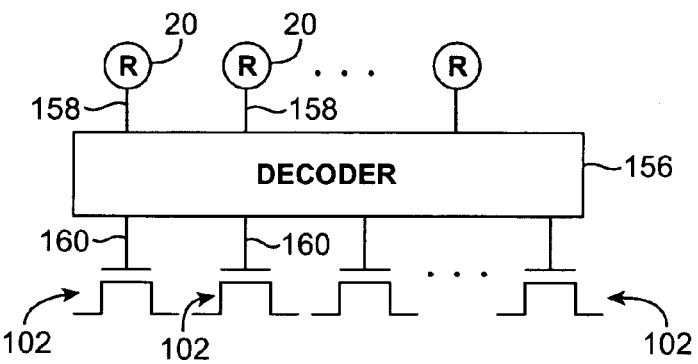
FIG. 13 is a diagram showing how the transistors in the programmable voltage divider of FIG. 10 may be controlled by control signals that are provided by programmable elements and decoded by a decoder in accordance with the present invention.

FIG. 13 shows a control arrangement that uses a decoder 156. Programmable elements 20 are used to provide control signals to decoder 156 on input lines 158. Decoder 156 contains logic that converts the undecoded control signals on input lines 158 into corresponding decoded control signals on lines 160. The lines 160 are used to route these control signals to the gates of respective transistors 102.

The use of a decoder such as the decoder 156 of FIG. 13 increases the complexity of the device 10. Moreover, circuit real estate is required for the logic of decoder 156 and the routing lines 158 and 160. Nevertheless, the use of a decoder such as decoder 156 reduces the need for programmable elements 20. For example, it is possible to control $2^N$ lines 160 using N programmable elements. In situations in which there are relatively large numbers of transistors 102, it may be more efficient to use a decoder 156 than to use a separate programmable element 20 to control each transistor 102.

Figure 14:
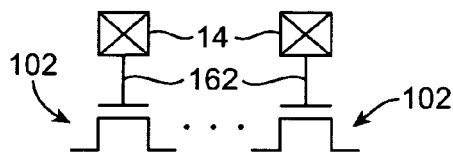
FIG. 14 is a diagram showing how each transistor in the programmable voltage divider of FIG. 10 may be controlled by an external control signal supplied through a respective input-output pin in accordance with the present invention.
Figure 15:
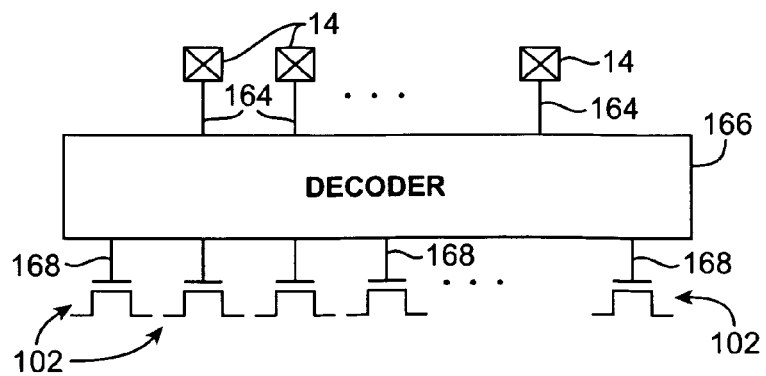
FIG. 15 is a diagram showing how the transistors in the programmable voltage divider of FIG. 10 may be controlled by control signals that are provided from an external source through input-output pins and decoded by a decoder in accordance with the present invention.

If desired, external control signals can be used to control the gates of transistors 102. As shown in FIG. 14, each transistor 102 may receive a control signal from a corresponding input-output pin 14 over an associated path 162. In the arrangement of FIG. 15, a decoder 166 is interposed between input-output pins 14 and transistors 102. Paths 164 convey undecoded control signals from input-output pins 14 to decoder 166. Paths 168 convey decoded control signals to transistors 102.

The control signals for lines 162 of FIG. 14 and lines 164 of FIG. 15 may be provided from an internal source (e.g., logic in programmable logic 18 of FIG. 1 or hardwired logic in device 10). These control signals may be generated dynamically during operation of device 10.

Combinations of these approaches may also be used. For example, some of the transistors 102 may be controlled by signals from dedicated programmable elements 20 as shown in FIG. 12 and/or by internally-supplied signals and/or externally-supplied signals on lines 162 of FIG. 14, whereas other transistors 102 may be controlled using decoders. Decoders may be supplied with undecoded control signals from programmable elements 20, programmable logic 18, or external sources.

The foregoing is merely illustrative of the principles of this invention and various modifications can be made by those skilled in the art without departing from the scope and spirit of the invention.

What is claimed is:

1. An integrated circuit comprising:
   an adjustable voltage regulator comprising:
      a chain of series-connected resistors;
      a plurality of transistors each having a first source-drain terminal that is connected between a respective pair of the series-connected resistors to establish a selectable voltage divider tap point that defines an associated tapped voltage, wherein the plurality of transistors each have a second source-drain terminal and wherein the second source-drain terminals are connected together;
      an operational amplifier having a first input that receives a reference signal, having a second input, and having an output;
      a feedback path that supplies the tapped voltage to the second input; and
      a transistor connected to the series-connected resistor chain.

2. The integrated circuit defined in claim 1 wherein the transistor has a gate that is connected to the output of the operational amplifier.

3. The integrated circuit defined in claim 1 further comprising a bandgap reference circuit that supplies the reference signal to the operational amplifier.

4. The integrated circuit defined in claim 1 further comprising:
   n-channel metal-oxide-semiconductor transistors having body terminals; and
   adjustable body bias circuitry that applies a body bias voltage to the body terminals, wherein the adjustable voltage regulator is included in the adjustable body bias circuitry.

5. The integrated circuit defined in claim 1 wherein the adjustable voltage regulator comprises a charge pump circuit containing a plurality of metal-oxide-semiconductor capacitors that produces a negative charge pump output voltage.

6. The integrated circuit defined in claim 5 wherein the transistor is connected between the charge pump circuit and the chain of series-connected resistors.

7. The integrated circuit defined in claim 6 wherein the transistor has a gate that is connected to the output of the operational amplifier.

8. An integrated circuit comprising:
   n-channel metal-oxide-semiconductor transistors having body terminals; and
   adjustable charge-pump-based body bias circuitry that applies a negative body bias voltage to the body terminals, wherein the adjustable charge-pump-based body bias circuitry comprises:
      a charge pump circuit that produces a negative charge pump output voltage;
      an adjustable voltage regulator that generates the negative body bias voltage using the negative charge pump output voltage; and
      a bandgap reference circuit that applies at least one reference signal to the adjustable voltage regulator.

9. The integrated circuit defined in claim 8 wherein the charge pump circuit includes a voltage divider, a comparator, an oscillator, and a charge pump, wherein the voltage divider in the charge pump circuit receives the negative charge pump output voltage from the charge pump over a feedback line and provides a corresponding signal to a first input of the comparator, wherein the comparator receives a voltage reference signal from the bandgap reference circuit at a second input, wherein the comparator compares the first input and second input and produces a corresponding output that controls the oscillator, and wherein the oscillator produces clock signals for the charge pump.

10. An integrated circuit comprising:
    n-channel metal-oxide-semiconductor transistors having body terminals; and
    adjustable charge-pump-based body bias circuitry that applies a negative body bias voltage to the body terminals, wherein the adjustable charge-pump-based body bias circuitry comprises:
       a charge pump circuit that produces a negative charge pump output voltage; and
       an adjustable voltage regulator that generates the negative body bias voltage using the negative charge pump output voltage, wherein the adjustable voltage regulator contains an adjustable voltage divider, wherein the adjustable voltage regulator contains a plurality of series-connected resistors and a plurality of transistors, wherein the transistors have gates and are connected between respective pairs of the series-connected resistors, and wherein the transistors are controlled by control signals applied to their gates to define a voltage tap point location in the series-connected resistors.

11. The integrated circuit defined in claim 10 wherein the integrated circuit comprises a programmable logic device integrated circuit, the integrated circuit further comprising programmable elements that are loaded with configuration data, and wherein the control signals that control the transistors are applied from the outputs of at least some of the programmable elements.

12. The integrated circuit defined in claim 10 wherein the integrated circuit comprises a programmable logic device integrated circuit, the integrated circuit further comprising programmable elements that are loaded with configuration data wherein the adjustable charge-pump-based body bias circuitry further comprises:
    a decoder having outputs, wherein the control signals that control the transistors are applied from the outputs of the decoder.

13. The integrated circuit defined in claim 10 wherein the integrated circuit comprises a programmable logic device integrated circuit, the integrated circuit further comprising programmable elements that are loaded with configuration data, wherein the adjustable charge-pump-based body bias circuitry further comprises:

a decoder having outputs and inputs, wherein the inputs receive control signals from at least some of the programmable elements, wherein the control signals that control the transistors are applied from the outputs of the decoder.

14. The integrated circuit defined in claim 10 wherein the integrated circuit comprises a programmable logic device integrated circuit, the integrated circuit further comprising programmable elements that are loaded with configuration data and input-output pins, wherein the adjustable charge-pump-based body bias circuitry further comprises:
a decoder having outputs and inputs, wherein the inputs receive control signals through the input-output pins and wherein the control signals that control the transistors are applied from the outputs of the decoder.

15. The integrated circuit defined in claim 10 wherein the integrated circuit comprises a programmable logic device integrated circuit, the integrated circuit further comprising programmable elements that are loaded with configuration data and programmable logic that produces signals, wherein the adjustable charge-pump-based body bias circuitry further comprises:
a decoder having outputs and inputs, wherein the inputs receive at least some of the signals from the programmable logic and wherein the control signals that control the transistors are applied from the outputs of the decoder.

16. A transistor body bias circuit on an integrated circuit, comprising:
a charge pump that produces a negative voltage;
an adjustable voltage regulator that produces a negative transistor body bias voltage using the negative voltage from the charge pump; and
a plurality of programmable elements loaded with configuration data that produce corresponding output signals that are applied to the adjustable voltage regulator to adjust the negative transistor body bias voltage.

17. The transistor body bias circuit defined in claim 16 wherein the adjustable voltage regulator comprises a voltage divider having a plurality of transistors each of which has a gate that receives one of the output signals from a respective one of the plurality of programmable elements.

18. The transistor body bias circuit defined in claim 16 further comprising:
a bandgap reference circuit that provides at least one reference signal to the adjustable voltage regulator, wherein the adjustable voltage regulator contains an adjustable voltage divider, wherein the adjustable voltage regulator generates the negative body bias voltage using the negative voltage produced by the charge pump, wherein the adjustable voltage regulator contains a plurality of resistors and a plurality of transistors, wherein the transistors are connected between respective pairs of the resistors, and wherein the transistors have gates each of which receives a respective output signal from a corresponding one of the programmable elements.

19. The transistor body bias circuit defined in claim 16 wherein the charge pump comprises metal-oxide-semiconductor transistor structures configured as metal-oxide-semiconductor capacitors, the body bias circuit further comprising:
a bandgap reference circuit that provides at least one reference signal to the adjustable voltage regulator, wherein the adjustable voltage regulator contains an adjustable voltage divider, wherein the adjustable voltage regulator comprises an operational amplifier and generates the negative body bias voltage using the negative voltage produced by the charge pump, wherein the adjustable voltage regulator contains a plurality of resistors and a plurality of transistors, wherein the transistors are connected between respective pairs of the resistors, wherein the transistors have gates each of which receives a respective output signal from a corresponding one of the programmable elements, and wherein the configuration data turns on a given one of the transistors to define a feedback path from the voltage divider to the operational amplifier that determines the negative body bias voltage.

20. An integrated circuit comprising:
n-channel metal-oxide-semiconductor transistors having body terminals;
adjustable body bias circuitry having a control input path that receives at least one control signal and having an output path that applies a negative body bias voltage to the body terminals based on the control signal; and
programmable elements loaded with configuration data that produce corresponding output signals that are applied to the adjustable body bias circuitry to adjust the negative body bias voltage.

21. The integrated circuitry defined in claim 20 wherein the adjustable body bias circuitry comprises adjustable charge-pump-based body bias circuitry.

* * * * *